(12) United States Patent
Bees (10) Patent No.: US 6,763,049 B1
(45) Date of Patent: Jul. 13, 2004

(54) VERY HIGH REPETITION RATE POWER SUPPLY SYSTEM AND METHOD

(75) Inventor: George L. Bees, Framingham, MA (US)

(73) Assignee: Lambda EMI, Neptune, NJ (US)

( * ) Notice: Subject to any disclaimer, the term of this patent is extended or adjusted under 35 U.S.C. 154(b) by 287 days.

(21) Appl. No.: 09/595,360

(22) Filed: Jun. 15, 2000

(51) Int. Cl.$^7$ .............................................. H01S 3/223
(52) U.S. Cl. ........................................ 372/58; 372/57
(58) Field of Search ........................ 372/55–60, 61–64, 372/38.03, 38.04, 82, 86, 25; 307/108

(56) References Cited

U.S. PATENT DOCUMENTS

| | | | | |
|---|---|---|---|---|
| 4,573,160 A | * | 2/1986 | Cirkel ........................... | 372/38 |
| 4,698,518 A | * | 10/1987 | Pacala ......................... | 307/106 |
| 4,803,378 A | * | 2/1989 | Richardson ................. | 307/108 |
| 5,105,097 A | * | 4/1992 | Rothe .......................... | 307/108 |
| 5,164,892 A | | 11/1992 | Kimbara | |
| 5,267,253 A | * | 11/1993 | Nakatani ...................... | 372/38 |
| 5,708,676 A | * | 1/1998 | Minamitani .................. | 372/86 |
| 6,330,258 B1 | * | 12/2001 | Kawamura .................... | 372/30 |
| 6,442,181 B1 | * | 8/2002 | Oliver et al. ................. | 372/25 |
| 6,477,193 B2 | * | 11/2002 | Oliver et al. ................. | 372/58 |

FOREIGN PATENT DOCUMENTS

| | | |
|---|---|---|
| DE | 3500182 | 7/1996 |
| WO | 4100719 A1 | 7/1992 |
| WO | WO99/31773 A | 6/1999 |
| WO | WO00/04612 A | 1/2000 |

* cited by examiner

Primary Examiner—Paul Ip
Assistant Examiner—Tuan N. Nguyen
(74) Attorney, Agent, or Firm—Kevin A. Oliver; Foley Hoag LLP (57) ABSTRACT

A system and method for a power supply system that charges a capacitor, wherein the capacitor charge drives a pulse discharge driven system. The power supply system utilizes a main power supply and a resonant inductor and capacitor configuration to charge the capacitor to a specified, large percentage of a driving voltage that is required by the pulse system. A control module monitors the capacitor charge and disconnects the main power supply when the capacitor charge is within the specified percentage. The main power supply disconnect causes the inductor to discharge and similarly charge the capacitor in a more controlled manner. Once the control module measures the capacitor voltage at the full driving voltage, the control module commands a switch to separate the inductor from the capacitor. The control module similarly activates a small high voltage power supply that monitors the capacitor and replenishes any natural capacitor discharge that may occur in the time between the full capacitor charge and the capacitor discharge by the pulse discharge driven system. Once the pulse discharge driven system discharges the capacitor, the control module returns the power supply system to its initial state, wherein the main power supply and residual energy in the capacitor cooperate to efficiently charge the inductor and capacitor. The charging cycle continues repeatedly as a function of the pulse discharge driven system requirements.

15 Claims, 5 Drawing Sheets

VERY HIGH REPETITION RATE POWER SUPPLY SYSTEM AND METHOD

BACKGROUND OF THE INVENTION (1) Field of the Invention

The present invention relates generally to power supply systems, and more particularly to power supply systems for high repetition rate pulse discharge driven systems.

(2) Description of the Prior Art

A large ampere current pulse that is a requirement of pulse discharge driven systems, is often realized through a capacitor that is charged to a certain voltage and discharged at a specified time to deliver the energy required of the pulse discharge driven system. Examples of pulse discharge driven systems include Doppler radar and lasers. In these systems, it is necessary to deliver the energy from the capacitor to the system in a precise manner, wherein the precision relates to the timing of energy delivered, and the amount of energy delivered. For instance, in a Doppler radar system, it is necessary to deliver the same energy each pulse repetition interval to allow the return signals to be properly processed, as fluctuations in the delivered energy may cause variability in the transmitted pulses that are then misinterpreted by the receiver. Similarly, a laser system requires the same precision in timing and energy for proper laser operation, as there is a nonlinear relationship between the energy delivered and the laser performance.

Prior art power supply systems utilize peaking capacitors in magnetic pulse compression circuits to provide a repetitive, high voltage, high energy charge to a peaking capacitor in a short duration. In such systems, multistage LC networks typically convert long, relatively low voltage pulses into the desired short, high voltage pulses. Other prior art systems include pulse power supply systems that supply excimer lasers with high voltage, short pulses. The majority of the prior art systems, however, operate in the 1000 Hz range. One prior art system operating at higher frequencies does not allow asynchronous operation, as the power supply system operation is coordinated precisely with the pulse discharge driven system. In that prior art system, the timing between the pulse discharge driven system and the charging capacitor reaching a specified voltage, must be synchronized precisely, as the problem of maintaining a specified voltage across a capacitor is well-known.

There is not currently an asynchronous power supply system for pulse discharge driven systems, wherein the power supply system may operate at higher repetition frequencies and not require synchronous coordination with the pulse discharge system.

What is needed is an efficient power supply system to accurately operate at higher pulse rates, wherein the power supply system may operate asynchronously with respect to the pulse discharge driven system.

SUMMARY OF THE INVENTION

It is an aspect of the invention to provide a power supply system that supplies electrical pulses to a pulse discharge driven system. In one aspect of the invention, the power supply system includes a pulse generating circuit with a charging inductor and a charging capacitor, wherein the charging capacitor drives the pulse discharge driven system. It is another aspect of the invention to select the charging inductor to achieve a time constant that is coordinated with the pulse rate of the pulse discharge driven system.

In one embodiment, the pulse generating circuit further includes a, "keep up" high-voltage power supply, three solid-state switches, and a diode. The voltage across capacitor is initially charged through the main power supply, wherein the time to charge the capacitor is determined in part by the charging inductor value. The capacitor voltage is monitored and compared to a predetermined "control" voltage that is less than a "driving" capacitor voltage that satisfies the requirements of the pulse charge driven system. Upon the capacitor voltage attaining the control voltage, a control module commands a solid-state switch to disconnect the main power supply from the circuit, thereby resulting in a sourceless (R)LC circuit that allows the capacitor to continue charging at a more controlled rate through the inductor discharge. Once the capacitor charges to the driving voltage, the control module commands two solid-state switches to separate the inductor from the capacitor, and similarly, the control module commands the keep-up supply to monitor and maintain the capacitor charge. If the capacitor discharges before the pulse discharge system utilizes the capacitor charge, the keep-up power supply replenishes the capacitor charge to the driving voltage.

It is another aspect of the invention that when the capacitor is discharged by the pulse discharge system, the control module returns the pulse generating circuit to its original state, incorporating the main power supply and inductor by returning the solid-state switches to their original states.

It is another aspect of the invention to supply power to a pulse discharge driven system, wherein the pulse discharge driven system is a laser.

Other objects and advantages of the invention will become obvious hereinafter in the specification and drawings.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings, wherein like reference numerals refer to like parts and wherein.

DESCRIPTION OF ILLUSTRATED EMBODIMENTS

To provide an overall understanding of the invention, certain illustrative embodiments will now be described; however, it will be understood by one of ordinary skill in the art that the systems described herein can be adapted and modified to provide systems for other suitable applications and that other additions and modifications can be made to the invention without departing from the scope hereof.

Figure 1:
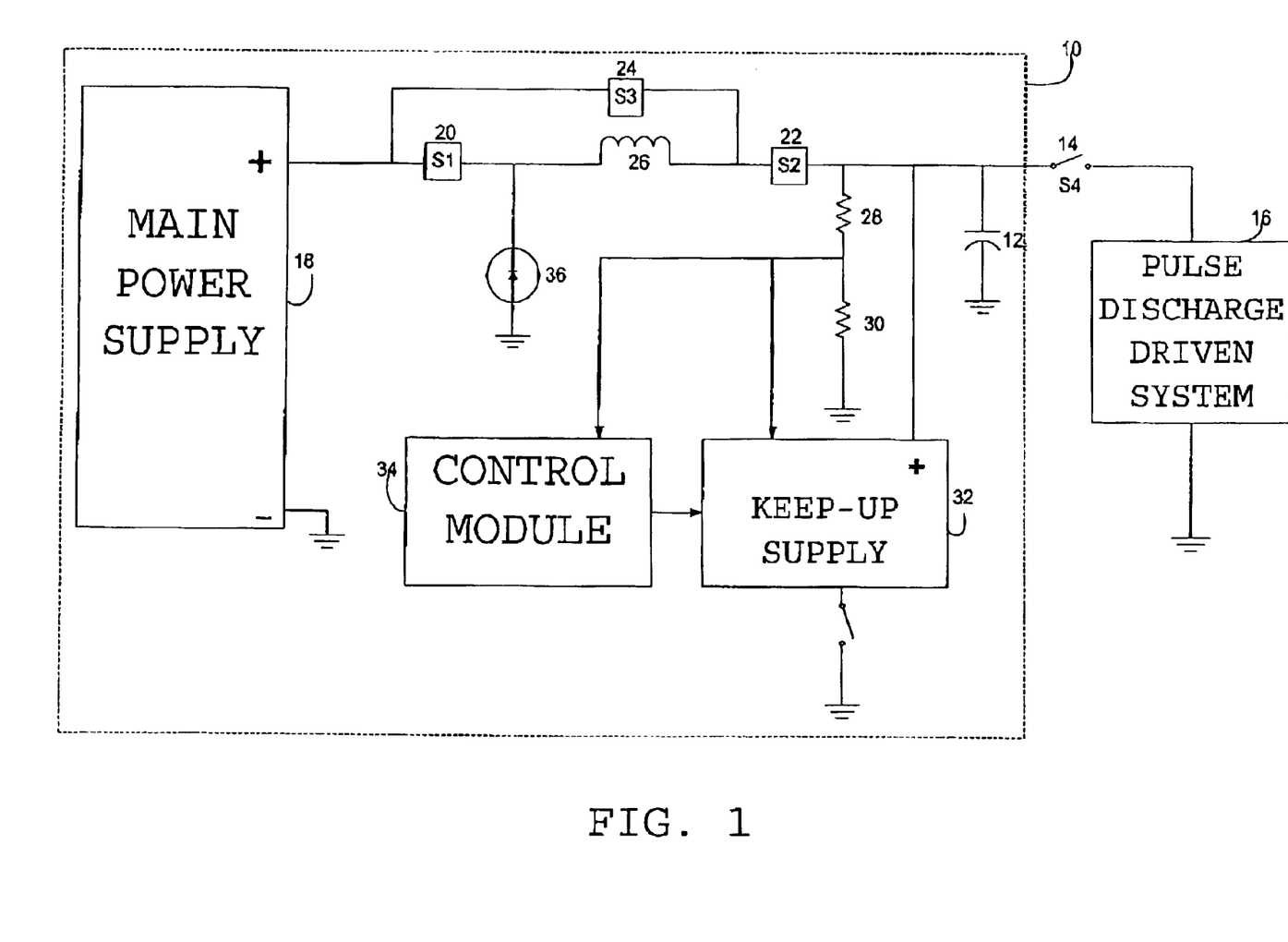
FIG. 1 displays a power supply system that incorporates the principles of the invention.

Referring now to FIG. 1, there is shown a power supply system 10 that incorporates the principles of the invention.

As illustrated in FIG. 1, the power supply system 10 charges a capacitor 12 that is coupled through a switch 14 to a pulse discharge driven system 16. Those skilled in the art will recognize that the capacitor 12 is merely illustrative and may be represented by any other well known component with capacitive properties. Similarly, examples of pulse discharge driven systems include lasers and Doppler radars, for example, although this invention is not limited to a specific pulse discharge driven system. For the purposes of this discussion, the pulse discharge driven system 16 will be referred to as a laser. The switch labeled S4 14 and otherwise referred to herein as S4, may be any switching device or circuitry that applies the capacitor voltage to the laser 16, and may include solid state switches, for example. In the FIG. 1 illustration, an S4 control system may control S4 14, wherein such control system is not depicted in FIG. 1. The S4 control system may operate S4 14 according to laser pulsing requirements. For example, if the laser operates at a frequency of 2000 Hz, the S4 control system may cause S4 14 to close every 500 microseconds for a predetermined length of time.

The power supply system 10 as illustrated charges the capacitor 12 to ensure that the capacitor voltage is the value required to drive the laser 16, hereinafter referred to as the driving voltage. The capacitor value is therefore dictated by the laser 16 specifications. Because pulse driven systems such as lasers have operational characteristics that are non-linear with respect to the driving voltage, it is a necessary requirement that the driving voltage be accurately determined and delivered. As FIG. 1 illustrates, the driving voltage for the laser 16 is provided by the capacitor 12, and the difficulties of maintaining a constant and precise charge across a capacitor are well known in the art. The FIG. 1 power supply system 10, however, discloses a system wherein resonant circuitry is incorporated to maintain a specified driving voltage across the capacitor 12.

Figure 2:
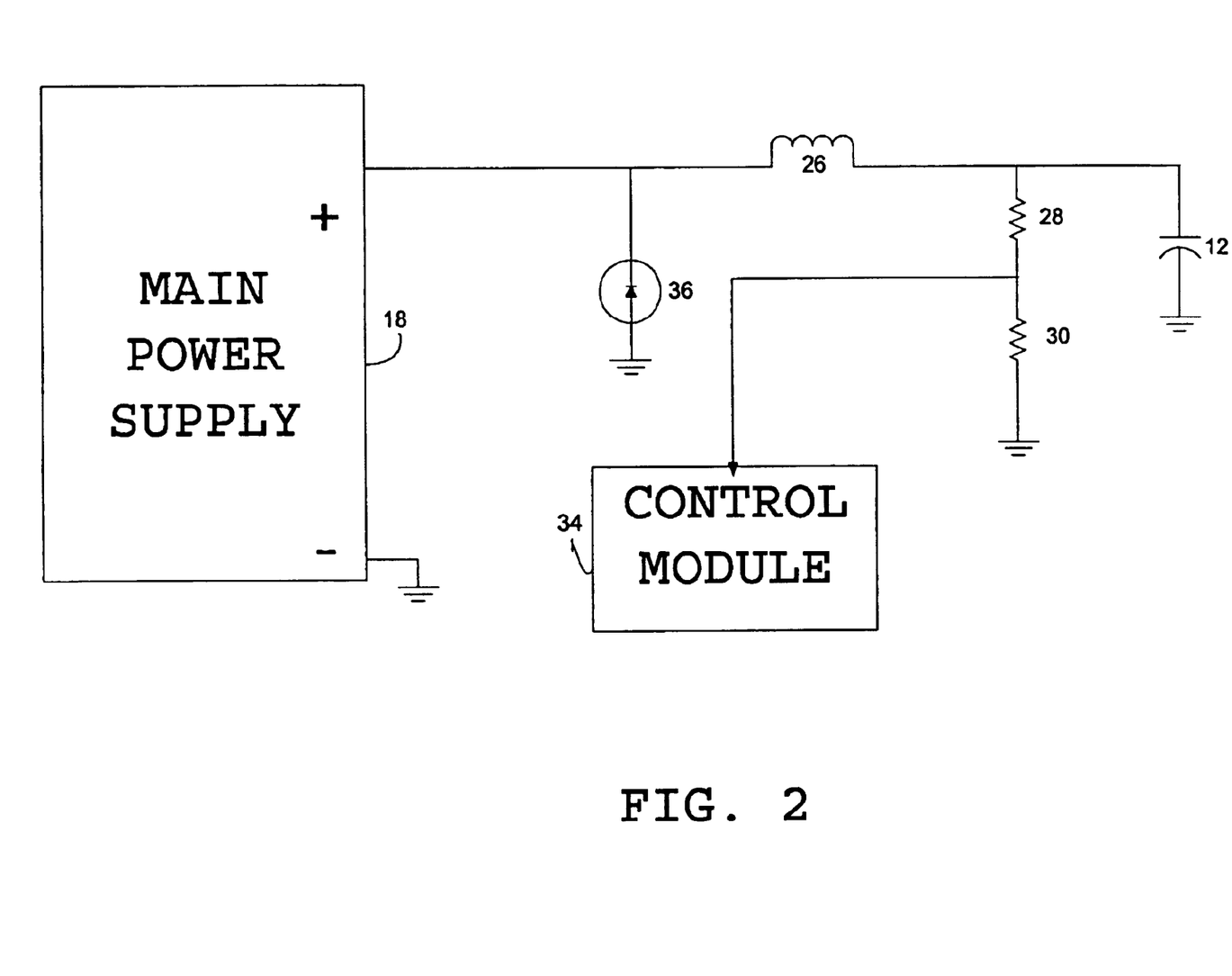
FIG. 2 displays the power supply system circuit of FIG. 1 while the power supply system is charging a capacitor from the main power supply.
Figure 3:
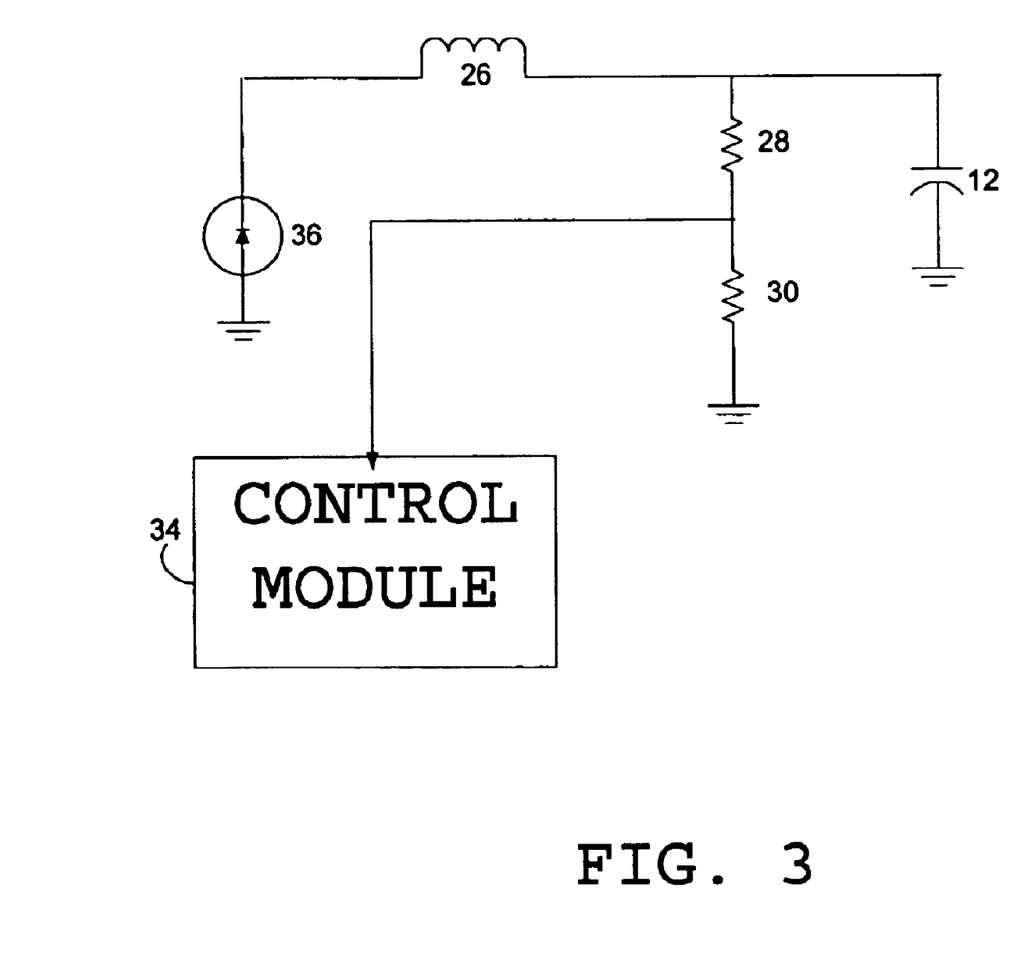
FIG. 3 presents the power supply system circuit of FIG. 1 wherein the capacitor is charging from an inductor.
Figure 4A:
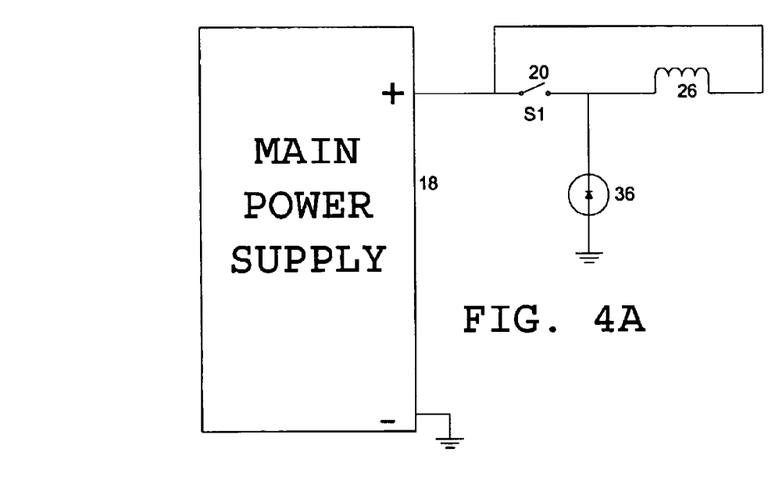
FIGS. 4a and 4b present the power supply system circuits derived from the power supply system of FIG. 1, wherein the keep-up supply is maintaining the capacitor charge; and, FIG. 5 illustrates the capacitor charging cycle throughout the power supply system circuits of FIGS. 2–4B.
Figure 4B:
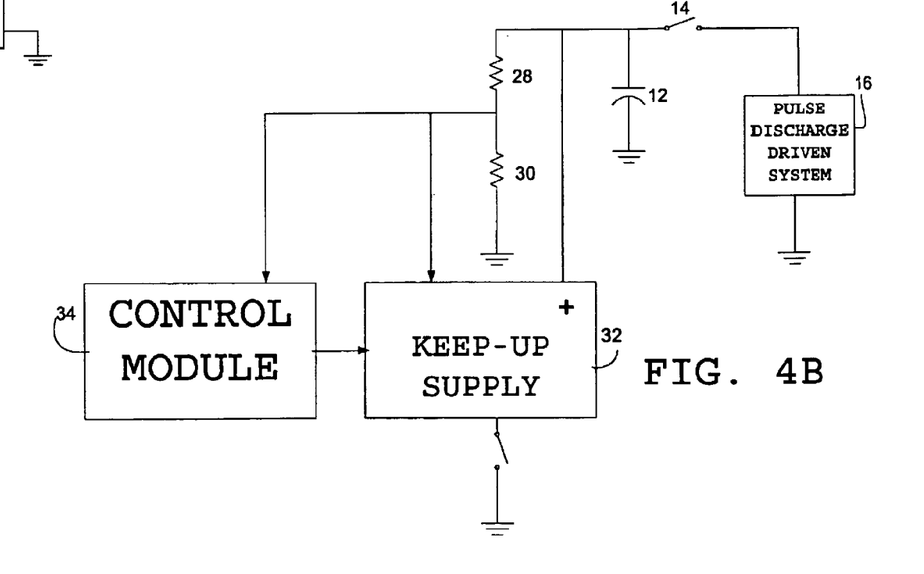

The various elements of the power supply system 10 are illustrated in FIG. 1, and are described relative to FIG. 1 briefly, with the detailed operation and interconnections to be further detailed and understood by the descriptions of FIGS. 2, 3, and 4. As FIG. 1 indicates, the power supply system 10 includes a main power supply 18. In an embodiment, the main power supply 18 is a 20 KW phase shifted zero voltage switch pulse width modulated (PWM) converter, operating at approximately 40 KHz, that converts three-phase line power to 1200 VDC, although such power supply specifications are merely illustrative and the invention herein is not limited to any specific main power supply. The illustrated system 10 also includes three switches labeled S1 20, S2 22, and S3 24, all of which may be any switching device, but in an embodiment, all of which are solid state switches. The invention does not require that the switches be of same or similar type to each other.

The illustrated chop inductor 26 is selected to provide a time constant that allows a capacitor charge time that satisfies, i.e., is less than, the pulse rate of the laser 16. For the illustrated system, for example, the charge time is approximately equal to $\tau \sqrt{*}\sqrt{L^*C}$. Two resistors, R1 28 and R2 30, are connected in parallel with the capacitor 12 in a commonly known voltage divider configuration. A keep-up power supply 32 is also connected in parallel with the capacitor 12, and in an embodiment, the keep-up power supply 32 is a high voltage power supply, although the invention is not limited by the keep-up power supply 32 specifications, and any similarly functioning element as described herein, may therefore be substituted without departing firm the invention. The power supply system 10 also includes a control module 34 that operates S1 20, S2 22, S3 24, and controls the operation of the keep-up power supply 32, and the main power supply 18. Although the illustrated control module 34 is not illustrated as microprocessor based, those skilled in the art will recognize that the control processor may be a microprocessor based device, including for example, a personal computer (PC), SUN workstation, laptop or handheld computer including personal digital assistant (PDA), connected through a network or in a stand-alone capacity, and functioning as described herein, without depth from the scope of the invention. As FIG. 1 indicates, the control module 34 and the keep-up power supply 32 measure the voltage drop across R1 28. The remaining element of the power supply system 10 is a diode 36.

Referring now to FIG. 2, there is illustrated a simplified power supply system circuit 40 that is representative of the FIG. 1 power supply system 10 wherein switches S1 20 and S2 22 are closed, and switch S3 24 is open. Recall from FIG. 1 that the S1 20, S2 22, and S3 24 switch operation is controlled by the control module 34. The FIG. 2 illustration is representative of the initial charge configuration, and shall be referred to herein accordingly.

From FIG. 2, one with ordinary skill in the art will recognize that the main supply 18 charges the capacitor 12 and inductor 26. The control module 34 immediately and continually monitors the voltage across R1 28 to maintain an accurate measurement of the voltage across the charging capacitor 12. Once the control module 34 determines that the capacitor 12 is charged to a predetermined percentage of the specified driving voltage, the control module 34 commands S1 20 to open, thereby disconnecting the main power supply 19 from the remainder of the power supply system 10. The predetermined percentage may be a function of the driving voltage, the keep-up supply 32 characteristics, and the laser (pulse discharge driven system) 16 characteristics.

Referring now to FIG. 3, there is shown the simplified circuit of FIG. 1 wherein S1 20 is open, S2 22 is closed, and S3 is open. In an embodiment, this switch configuration, represented by the FIG. 3 circuit, is commanded by the control module 34 when the control module 34 measures that the capacitor 12 is charged to 95% of the driving voltage. As FIG. 3 indicates, the main power supply of FIGS. 1 and 2 is no longer connected to the circuit power supply system segment that includes the capacitor 12. One with ordinary skill in the art will recognize that the source-less circuit of FIG. 3 will cause the inductor 26 to discharge with an exponential decay, with current flowing through the diode 36, and allowing the capacitor 12 to continue charging at a slower rate than the charge rate provided by the main power supply 18 in FIG. 2. The control module 34 continues to monitor the capacitor 12 through R1 28, and when the control module senses that the capacitor 12 has charged to 100% of the specified driving voltage, the control system 34 commands S2 22 to open, and S3 24 to close. Additionally, the control module 34 activates the keep-up supply 32 to monitor and maintain the capacitor 12 charge.

FIGS. 4A and 4B represent the simplified circuit diagram of FIG. 1 wherein switch S1 20 is open, S2 22 is open, and S3 24 is closed. As FIGS. 4A and 4B illustrate, the FIG. 1 power supply system 10 simplifies into two individual circuits for the given switch configuration. The circuit illustrated by FIG. 4A includes the main power supply 18, the inductor 26, and the diode 36. Any energy remaining in the inductor 26 will be transferred to the main power supply 18.

Alternately, the circuit illustrated in FIG. 4B includes the series combination of R1 28 and R2 30, connected in parallel with the capacitor 12, and similarly in parallel to the activated keep-up supply 32. Those skilled in the art will recognize that if the capacitor 12 is not discharged by the laser 16 of FIG. 1 nearly immediately after the switch configuration represented by FIGS. 4A and 4B is achieved, the voltage across the FIG. 4B capacitor 12 will exponentially decay through R1 28 and R2 30, and other system losses; therefore, the activated keep-up supply 32 monitors the loss through R1 28 and compensates for the loss by recharging the capacitor 12. In embodiment, the illustrated keep-up supply 32 activates whenever the keep-up supply 32 determines the capacitor discharge loss exceeds one volt. The keep-up supply 32 continues to replenish the capacitor 12 to maintain the capacitor voltage at the desired driving voltage. This replenishing cycle performed by the keep-up supply 32 may continue indefinitely. In this configuration, the control module 34 also continues to monitor the voltage across the capacitor 12 by measuring the voltage drop across R1 28.

Those skilled in the art will recognize that the keep-up supply 32 monitoring and maintenance functions may be performed in many ways while remaining within the scope of the invention. For example, the keep-up supply 32 may receive and store the driving voltage, and compare the measured voltages to the stored driving voltage to determine when the capacitor 12 requires recharging. The keep-up supply 32 may measure the voltage across R1 28 using well-known sample-and-hold technology, using either digital or analog circuitry, but the invention is not limited to such technique. Alternately, the control module 34 may provide the driving voltage to the keep-up supply 32, or the keep-up supply driving voltage reference may be established as that voltage first measured by the keep-up supply 32 after the control module 34 activates the keep-up supply 32.

Figure 5:
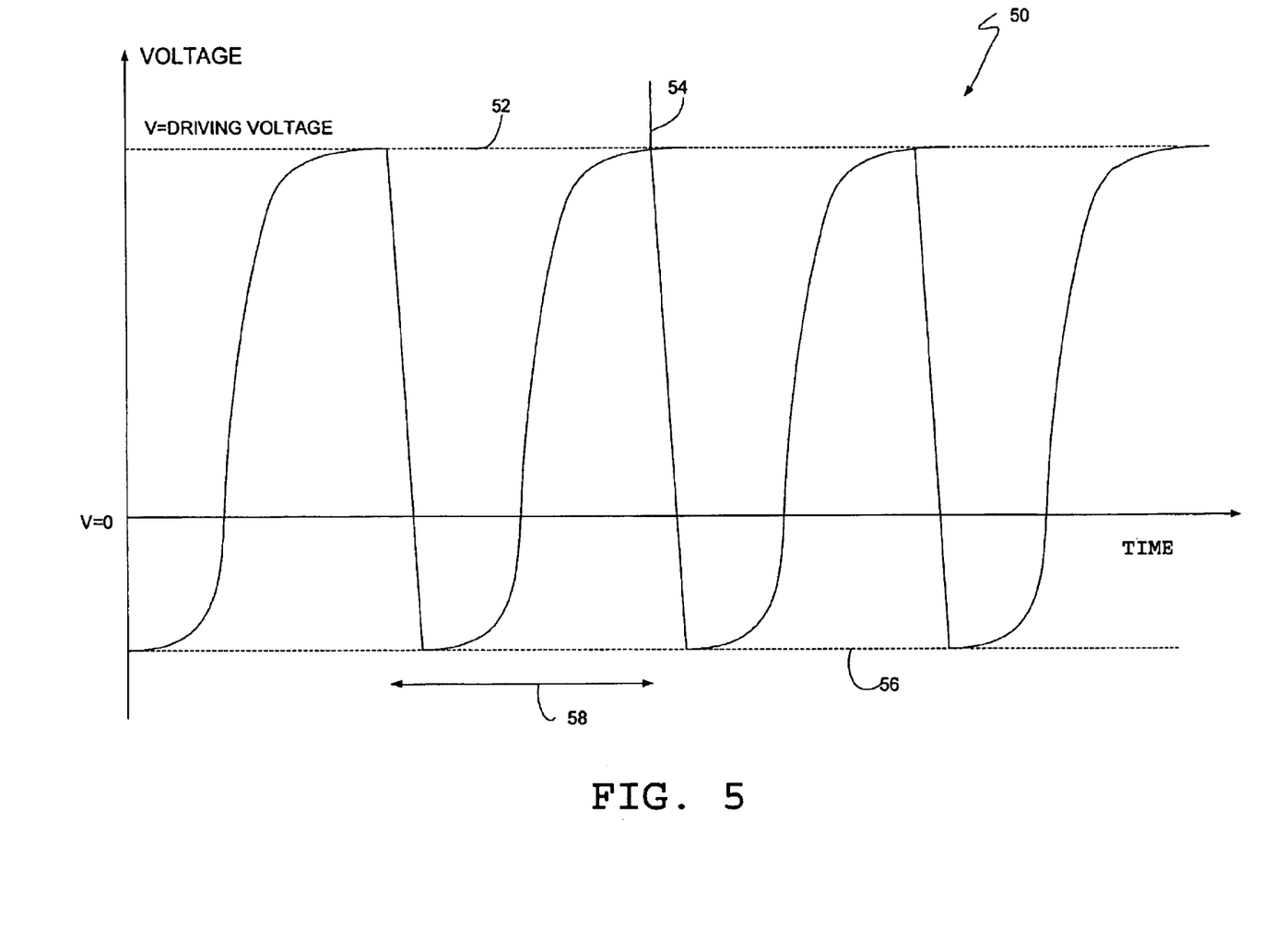

Those skilled in the art will also recognize that the control module 34 may measure the capacitor voltage using many different well-known techniques, some of which are referred to in the discussion of the keep-up supply 32, without departing from the scope of the invention. Because the illustrated control module 34 continuously monitors the voltage across the capacitor 12, the control module 34 measures the significant capacitor voltage drop that occurs when, in the present example, the capacitor 12 is discharged by the illustrated laser 16 of FIG. 1. The illustrated laser 16 of FIG. 1 presents an output load with extremely small impedance; therefore, when switch S4 14 closes, the capacitor voltage is discharged to the laser 16, but the load mismatch between the capacitor 12 and the laser 16 causes a reversal of current, and hence a reversal in the sign of the voltage at the capacitor 12. Referring now to FIG. 5, there is shown the voltage across the capacitor 12 as a function of time 50. As FIG. 5 indicates, the capacitor voltage is at the driving voltage 52 when S4 is closed 54, whereupon within, for example, approximately five to ten microseconds in some applications, the capacitor 12 discharges, wherein the capacitor voltage drops from the driving voltage 52, to a negative voltage 56. Those skilled in the art will recognize that this negative voltage represents energy that may be expressed by the well known expression of $\frac{1}{2}CV^2$, where C is the capacitor 12 value, and V is the voltage across the capacitor.

Upon the control module 34 sensing the significant and nearly instantaneous capacitor voltage drop that occurs when S4 14 is closed, the control module 34 returns the power supply system 10 to the initial charge configuration of FIG. 2, wherein S1 20 is closed, S2 22 is closed, and S3 24 is open. Additionally, the control module 34 deactivates the keep-up supply 32. The power supply system 10 is therefore returned to the initial charge configuration of FIG. 2. In this configuration, however, the inductor 26 is connected to the main power supply 18 on one end, and the capacitor 12 with negative voltage at the other end. This difference in voltage, in combination with the diode 36 preventing current flow away from the inductor 26, causes a large current surge through the inductor that transfers the energy in the capacitor 12 to the inductor 26 and facilitates a more responsive charge of the inductor and capacitor to meet the laser 16 requirements. This inherent recovery of capacitor 12 energy due to the capacitor voltage reversal facilitates a power supply system 10 that is compatible with higher repetition rate laser.

In alternate embodiments, the control module 34 may sense the discharge by the pulse discharge driven system 16 by receiving a signal from the pulse discharge driven system 16, for example. Those skilled in the art will recognize that other methods of sensing the capacitor discharge may be incorporated without departing from the invention.

In another embodiment, the control module 34 may control the main power supply 18 for shut-down in the case of system failure.

This series of charging the capacitor 12, in this example, to 95% of the driving voltage, as shown by FIG. 2, thereafter removing the main power supply 18 to allow the inductor 26 to continue charging the capacitor 12 to 100% of the driving voltage, as illustrated and demonstrated by FIG. 3, and activating the keep-up supply 32 to maintain the capacitor charge as shown by FIG. 4B, continuously repeats with the required frequency and duration specified by the pulse discharge driven system 16, wherein the cyclic capacitor voltage may be illustrated by FIG. 5. As shown by FIG. 5, although the illustrated power supply system 10 components are selected to satisfy a pulsing interval 58 of the laser 16, it is not necessary that the power supply system 10 be synchronized precisely with the laser pulsing interval 58. For example, prior art power supply systems that cannot indefinitely maintain the charge across the driving capacitor 12, are coordinated precisely with the end of each pulsing interval 58 to ensure the fully charged capacitor condition occurs synchronously with the laser discharge.

One of several advantages of the present invention over the prior art is that the power supply system 10 may charge and thereafter maintain a charge across the capacitor 12 to drive the pulse discharge driven system 16, wherein the capacitor charging and maintenance thereof is not required to be synchronized with the discharge by the pulse discharge driven system 16.

What has thus been described is a system and method for a power supply system that charges a capacitor, wherein the capacitor charge drives a pulse discharge driven system. The power supply system utilizes a main power supply and a resonant inductor and capacitor configuration to charge the capacitor to a specified, large percentage of a driving voltage that is required by the pulse system. A control module monitors the capacitor charge and disconnects the main power supply when the capacitor charge is within the specified percentage. The main power supply disconnect causes the inductor to discharge and similarly charge the capacitor in a more controlled manner. Once the control module measures the capacitor voltage at the full driving voltage, the control module commands a switch to separate the inductor from the capacitor. The control module similarly activates a small high voltage power supply that monitors the capacitor and replenishes any natural capacitor discharge that may occur in the time between the full capacitor charge and the capacitor discharge by the pulse discharge driven system. Once the pulse discharge driven system discharges the capacitor, the control module returns the power supply system to its initial state, wherein the main power supply and residual energy in the capacitor cooperate to efficiently charge the inductor and capacitor. The charging cycle continues repeatedly as a function of the pulse discharge driven system requirements.

Although the present invention has been described relative to a specific embodiment thereof, it is not so limited. Obviously many modifications and variations of the present invention may become apparent in light of the above teachings. For example, the system presented herein represented a laser, but other pulse discharge driven systems may be substituted. Although the example charged the capacitor to 95% of the driving voltage before separating and deactivating the main power supply, such criteria is merely for illustrative purposes and other values may be selected. The switches in an embodiment are solid state devices, however any other switching mechanism may be used. Similarly, all switches are not required to utilize the same technology. The main power supply represented may be any power supply supplying any waveform or signal sufficient to charge the inductor and capacitor to the desired values. Similarly, the keep-up supply may be substituted by any device or mechanism that may perform the functions described herein and attributed to the keep-up supply in measuring and maintaining the capacitor voltage. The control module includes any device capable of monitoring and controlling the switches and power supplies as described herein. Similarly, functions such as those described for the keep-up supply and control module, for example, may be combined into a single device without departing from the scope of the invention. The control module may sense that the capacitor was discharged by the pulse discharge driven system by measuring the voltage, or alternately, by monitoring the switch to the pulse discharge driven system, or obtaining a signal from a pulse discharge driven system control module, indicating that the capacitor was discharged. The voltage divider configuration may be eliminated and substituted with another scheme.

Many additional changes in the details, materials, steps and arrangement of parts, herein described and illustrated to explain the nature of the invention, may be made by those skilled in the art within the principle and scope of the invention. Accordingly, it will be understood that the invention is not to be limited to the embodiments disclosed herein, may be practiced otherwise than specifically described, and is to be understood from the following claims, that are to be interpreted as broadly as allowed under the law.

I claim:

1. A power supply system for a pulse discharge system, the power supply system comprising:
   an input connection to a main power supply;
   an output connection to a capacitor for storing energy to be delivered to the pulse discharge system;
   a switching mechanism coupled between the input connection and the output connection, the switching mechanism having a first configuration for coupling the output connection to the main power supply, and a second configuration for decoupling the output connection from the main power supply, the switching mechanism including; (i) a first switch connected in series between the main power supply and an inductor; (ii) a second switch connected in series between the inductor and the capacitor; and, (iii) a third switch connected in parallel to the series combination of the fast switch and the inductor;
   a sensor for monitoring a characteristic representative of a voltage across the capacitor;
   a controller, responsive to the voltage across the capacitor, for controlling the switching mechanism in switching between the first and the second configuration; and,
   a keep-up supply, responsive to the voltage across the capacitor, and to the controller, the keep-up supply for delivering energy to the capacitor to maintain the voltage at a predetermined driving voltage.

2. A power supply system according to claim 1, wherein the switching mechanism includes an inductor arranged for storing energy when the switching mechanism is in the first configuration, and for delivering energy to the capacitor when the switching mechanism is in the second configuration.

3. A power supply system according to claim 1, wherein the inductor and capacitor are selected to provide a time constant that is less than a pulse rate associated with the pulse discharge system.

4. A power supply system according to claim 1, wherein the keep-up supply comprises:
   an input module to receive measurements of the voltage across the capacitor;
   a memory to store a driving voltage required by the pulse discharge driven system;
   a comparator to compare the voltage across the capacitor to the driving voltage; and,
   a charging module to replenish the charge across the capacitor when the capacitor discharges.

5. A power supply system according to claim 1, wherein the sensor comprises a voltage divider connected in parallel to the capacitor.

6. A power supply system according to claim 1, wherein the pulse discharge driven system includes a laser.

7. A power supply system according to claim 1, wherein the pulse discharge driven system includes a Doppler radar.

8. A method for supplying power through a charging capacitor to a pulse discharge driven system, comprising:
   determining a driving voltage representing the voltage to charge the capacitor;
   providing a circuit having a main power supply, an inductor, and the capacitor, wherein the main power supply is connected in series with the inductor and the capacitor, and the inductor is placed between the main power supply and the capacitor, and further including a switching mechanism, where the switching mechanism includes; (ii) a first switch connected in series between the main power supply and an inductor; (ii) a second switch connected in series between the inductor and the capacitor; and, (iii) a third switch connected in parallel to the series combination of the first switch and the inductor;
   activating the main power supply;
   removing the main power supply while the capacitor voltage is less than the driving voltage;
   disconnecting the inductor from the capacitor when the capacitor voltage equals the driving voltage, while activating a keep-up power supply; and,
   replenishing the capacitor voltage using the keep-up supply in response to the capacitor voltage discharging below the driving voltage.

9. A method according to claim 8, wherein providing a circuit further comprises:
   determining a pulse rate of the pulse discharge driven system; and,
   selecting an inductor that, together with the capacitor, provide a time constant that is less than the pulse rate.

10. A method according to claim 8, wherein removing the main power supply further comprises opening the switch.

11. A method according to claim 8, wherein removing the main power supply further comprises determining that the capacitor voltage is 95% of the driving voltage.

12. A method according to claim 8, wherein disconnecting the inductor from the capacitor further comprises opening the second switch.

13. A method according to claim 12, further comprises closing third switch.

14. A method according to claim 8, further comprising determining the voltage across the capacitor.

15. A method according to claim 14, wherein determining the voltage further comprises:

placing a voltage divider in parallel with the capacitor; and, measuring a voltage at a point along the voltage divider.

* * * * *